United States Patent [19]

Pleshko

[11] 3,879,619

[45] Apr. 22, 1975

[54] MOSBIP SWITCHING CIRCUIT

[75] Inventor: Peter Pleshko, Katonah, N.Y.

[73] Assignee: International Business Machines Corporation, Armonk, N.Y.

[22] Filed: June 26, 1973

[21] Appl. No.: 373,843

[52] U.S. Cl. ................. 307/251; 307/205; 307/255
[51] Int. Cl. ............................................ H03k 17/60
[58] Field of Search ........... 307/205, 213, 218, 251, 307/253, 254, 304, 255; 330/13, 17, 35

[56] References Cited

UNITED STATES PATENTS

| | | | |
|---|---|---|---|
| 3,222,610 | 12/1965 | Evans et al. | 307/251 X |
| 3,243,732 | 3/1966 | Schnitzler | 307/304 X |
| 3,311,756 | 3/1967 | Nagata et al. | 307/304 |
| 3,541,353 | 11/1970 | Seelbach et al. | 307/205 X |
| 3,601,712 | 8/1971 | Elazar | 307/304 X |

*Primary Examiner*—John Zazworsky
*Attorney, Agent, or Firm*—Sughrue, Rothwell, Mion, Zinn and Macpeak

[57] ABSTRACT

A MOSFET-bipolar switching circuit is disclosed which exhibits the characteristics of impedance mismatch between input and output, simple biasing requirements, high speed, and low standby power. In one embodiment, an N channel MOSFET is connected to provide a shunt feedback path from the collector to the base of an NPN bipolar transistor. A similar circuit results in the combination of a PNP bipolar transistor and a P channel MOSFET. In another embodiment, a pair of complementary MOSFET's are employed to drive a pair of complementary bipolar transistors. The circuit can be used either as a driver or for logic and may be fabricated in high density, integrated circuits.

3 Claims, 3 Drawing Figures

MOSBIP SWITCHING CIRCUIT

BACKGROUND OF THE INVENTION

1. Field of the Invention:

The present invention generally relates to semiconductor circuits and more particularly to metal oxide semiconductor field effect transistor (herein referred to as MOSFET) and bipolar transistor high-speed switching circuits. The combination of a MOSFET and a bipolar transistor is conveniently referred to as a MOSBIP.

2. Description of the prior Art:

The desirable electrical characteristics of switching circuits are impedance mismatch between input and output, simple biasing requirements, high speed, and low standby power. MOSFET's and bipolar transistors have been used in switching circuits to provide high input impedance and low output impedance. In order to further enhance the impedance mismatch between input and output, it has been necessary to cascade bipolar transistor stages. This, however, reduces the switching speed and increases the power requirements.

SUMMARY OF THE INVENTION

It is accordingly an object of this invention to provide a new and improved high speed switching circuit.

More particularly, it is an object of this invention to provide a switching circuit utilizing MOSFET's and bipolar transistors exhibting enhanced impedance mismatch and improved high speed switching and low standby power characteristics.

The foregoing and other objects are attained by connecting a MOSFET such that it provides a shunt feedback path from the collector to the base of a like conductivity type bipolar transistor. This results in a switching circuit with the low power and high input impedance of MOSFET circuits but with the current gain and low output impedance of bipolar circuits. Since the MOSFET and the bipolar transistor are directly connected, biasing requirements are greatly simplified. Improved high speed switching and decreased power requirements are achieved because only two stages are required.

BRIEF DESCRIPTION OF THE DRAWING

This specific nature of the invention, as well as other objects, aspects, uses and advantages thereof, will clearly appear from the following description and from the accompanying drawing in which.

DESCRIPTION OF THE PREFERRED EMBODIMENTS

Figure 1:
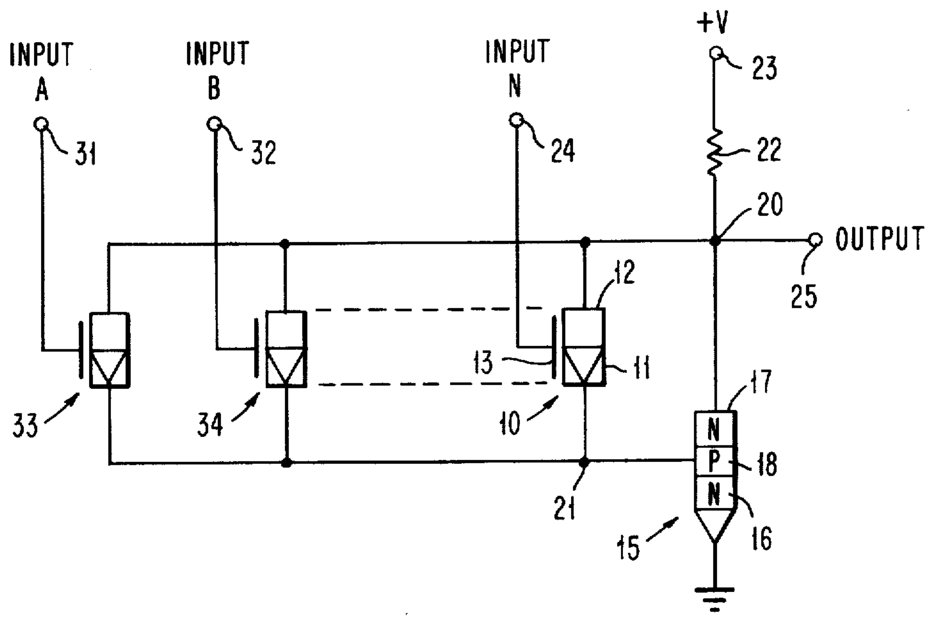
FIG. 1 is a schematic drawing of an illustrative embodiment showing the basic concept of the invention and indicating how multiple inputs may be connected.

Referring now to the drawing, and more particularly to FIG. 1, transistor 10 is an N channel MOSFET having a source electrode 11, a drain electrode 12 and a gate electrode 13. Transistor 15 is an NPN bipolar transistor having an emitter 16, a collector 17 and a base 18. The drain electrode 12 of MOSFET 10 and the collector 17 of NPN transistor are connected to a common junction 20, and the source electrode 11 of MOSFET 10 and the base of NPN transistor 15 are connected to a common junction 21. Junction 20 is connected through a load impedance 22 to a source of positive voltage at terminal 23. The emitter 16 of NPN transistor 15 is connected directly to ground. An input switching signal in the form of a voltage pulse is applied to the gate electrode 13 of MOSFET 10 by means of input terminal 24, while the output signal is obtained at output terminal 25 which is directly connected to junction 20.

The connection of MOSFET 10 is such that it provides a shunt feedback path from collector 17 to the base 18 of NPN transistor 15. This results in a very low output impedance, being approximately equal to the drain-source impedance of MOSFET 10 divided by the collector-base current gain of NPN transistor 15. Thus, an enhanced impedance mismatch between input 24 and output 25 without the need for cascading additional stages of bipolar transistors is provided by this circuit. Similar results are attained by substituting a P channel MOSFET for N channel MOSFET 10 and a PNP transistor for NPN transistor 15. This substitution would, of course, require a source of negative voltage to be applied at terminal 23. The use of a P channel MOSFET and a PNP transistor will be illustratively described in more detail hereinafter with reference to FIG. 2 of the drawing. The important point to remember here is that the MOSFET and the bipoolar transistor are like conductivity type semiconductor devices.

Multiple inputs are easily accommodated by providing additional MOSFET's, one for each input, connected in cascade. Thus, for example, inputs A and B are illustrated as applied to terminals 31 and 32, respectively, which are in turn connected to the respective gate electrodes of N channel MOSFET's 33 and 34. The drain electrodes of MOSFET's 33 and 34 are directly connected to junction 20 and thence to the collector 17 of transistor 15, while the source electrodes of MOSFET's 33 and 34 are directly connected to junction 21 and thence to the base 18 of transistor 15. For purposes of illustration, the input at terminal 24 is labelled input N to indicate any desired number of inputs may be accommodated.

Since each MOSFET in a multiple input circuit is cascaded, each node at the drain electrodes has a low impedance and the same impedance mismatch between input and output and the same high speed switching performance, as in the single input circuit is achieved. The biasing requirements are kept to a minimum also due to the fact that the circuits may be cascaded directly.

Figure 2:
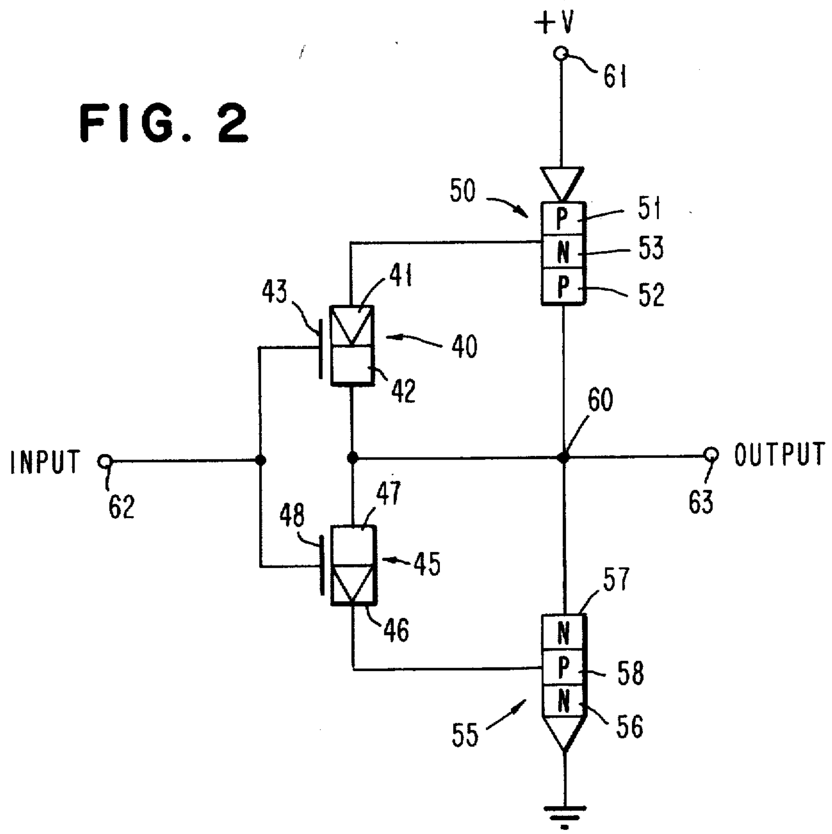
FIG. 2 is another schematic drawing showing an embodiment of the invention utilizing a complementary pair of MOSFET's connected to a corresponding complementary pair of bipolar transistors.

In order to realize more fully the desirable low standby power requirements, the circuit shown in FIG. 2 comprising two complementary pairs of devices can be used. In this embodiment, transistor 40 is a P channel MOSFET having a source electrode 41, a drain electrode 42 and a gate electrode 43, and transistor 45 is an N channel MOSFET having a source electrode 46, a drain electrode 47 and a gate electrode 48. Transistor 50 is a PNP bipolar transistor having an emitter 51, a collector 52 and a base 53, and transistor 55 is an NPN bipolar transistor having an emitter 56, a collector 57 and a base 58. P channel MOSFET 40 is connected to provide collector to base feedback for PNP transistor 50 by having its drain electrode 42 connected to the collector 52 of PNP transistor 50 through junction 60 and its source electrode 41 directly connected to base 53. N channel MOSFET 45 is connected to provide collector to base feedback for NPN transistor 55 by having its drain electrode 47 connected to the collector 57 of NPN transistor 55 through junction 60 and its source electrode 46 directly connected to base 58. The emitter 51 of PNP transistor 50 is connected to a source of positive voltage at terminal 61, while the emitter 56 of NPN transistor 55 is grounded. An input signal is applied at terminal 62 which is directly connected to the gate electrodes 43 and 48 of P channel MOSFET 40 and N channel MOSFET 45, respectively. As will be understood by those skilled in the art, multiple inputs may be accommodated by combining P channel MOSFET's and N channel MOSFET's in parallel and in series, respectively. The output signal is obtained at terminal 63 which is directly connectioned to junction 60.

The complementary pair circuit shown in FIG. 2 exhibits all the desirable characteristics of enhanced impedance mismatch between input and output, very high speed switching and simple biasing requirements as the circuit in FIG. 1 and has the additional advantage of decreased standby power. In the complementary pair circuit of FIG. 2, the standby power is limited only by the leakage currents. Modeling predicts that 1 picojoule power-delay product is achievable at a switching speed of 50 picoseconds.

Figure 3:
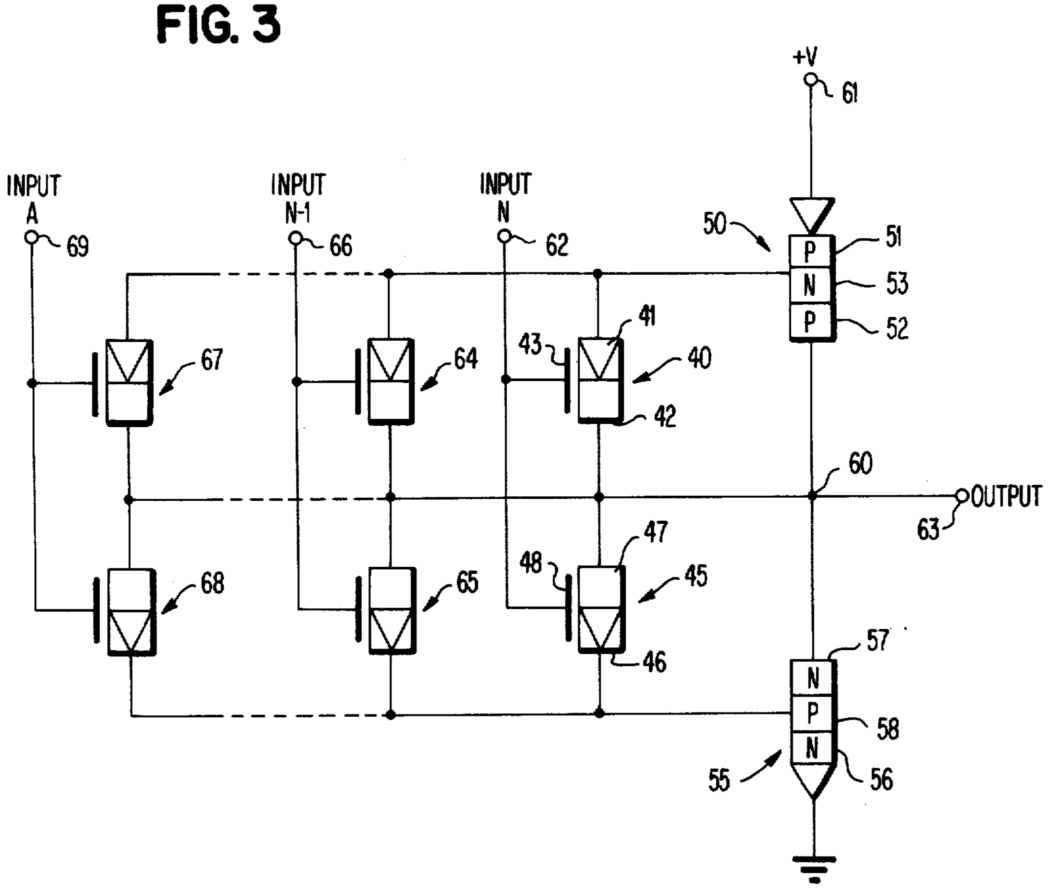
FIG. 3 is a schematic drawing showing an embodiment of the invention using complementary pairs of MOSFET's connected as in FIG. 2 and indicating how multiple inputs may be connected as in FIG. 1.

FIG. 3 illustrates how the complementary pair circuits shown in FIG. 2 may be made to accommodate multiple inputs by providing additional complementary pair MOSFET's, one pair for each input, connected in cascade in the same manner as taught with respect to the circuit shown in FIG. 1. In FIGS. 2 and 3, like reference numerals represent identical or corresponding parts. Thus, in FIG. 3 inputs A . . . N–1, and N are illustrated as applied to terminals 69, 66 and 62, respectively. Terminal 69 is connected to the gate electrodes of P channel MOSFET 67 and N channel MOSFET 68, while terminal 66 is connected to the gate electrodes of P channel MOSFET 64 and N channel MOSFET 65. Each of the P channel MOSFET's 40, 64 and 67 are connected to provide collector to base feedback for PNP transistor 50 by having its drain electrode connected to collector 52 of PNP transistor 50 through junction 60 and its source electrode directly connected to the base 53. In the same manner, each N channel MOSFET, 45, 65 and 68, is connected to provide collector to base feedback for NPN transistor 55 by having its drain electrode connected to the collector 57 of NPN transistor 55 through junction 60 and its source electrode directly connected to base 58.

The circuits illustratively shown in FIGS. 1, 2 and 3 or variations of them can be used either as drivers or for logic. They may be easily fabricated in high density integrated circuits owing in part to the simple biasing requirements and low operating power requirements and, especially in the case of the circuit shown in FIGS. 2 and 3 low standby power requirements. The enhanced impedance mismatch between input and output is due to the unique configuration of MOSFET connected to provide collector to base feedback in a like conductivity type bipolar transistor. This simple configuration and the fact that bipolar transistors do not go into saturation contribute to the achievement of very high speed switching operation in the circuits. It should be understood, therefore, that the foregoing disclosure relates to preferred embodiments of the invention and that numerous modifications may be made without departing from the spirit and the scope of the invention as set forth in the appended claims.

I claim:

1. A high speed switching circuit comprising:

a first bipolar transistor having an emitter, a collector and a base, a first metal oxide semiconductor field effect transistor of like conductivity type as said first bipolar transistor, said metal oxide semiconductor field effect transistor having a source electrode, a drain electrode and a gate electrode, said drain electrode being connected to the collector of said first bipolar transistor and said source electrode being connected to the base of said first bipolar transistor to provide collector to base feedback for said first bipolar transistor, a second, opposite conductivity type bipolar transistor having an emitter, a collector and a base, a second, opposite conductivity type metal oxide semiconductor field effect transistor having a source electrode, a drain electrode and a gate electrode, said drain electrode being connected to the collector of said second bipolar transistor and said source electrode being connected to the base of said second bipolar transistor to provide collector to base feedback for said second bipolar transistor, biasing means connected across said emitter and collector of said first bipolar transistor and across said collector and emitter of said second bipolar transistor in series to provide an operating voltage, input means connected directly to the gate electrodes of said first and second metal oxide semiconductor field effect transistors, and output means connected directly to the collectors of said first and second bipolar transistors.

2. A high speed switching circuit as defined in claim 1 wherein said first bipolar transistor is a PNP transistor and said first metal oxide semiconductor field effect transistor is a P channel transistor and wherein said second bipolar transistor is an NPN transistor and said second metal oxide semiconductor field effect transistor is an N channel transistor.

3. A high speed switching circuit as defined in claim 1 for accommodating multiple inputs comprising:

an additional pair of opposite conductivity type metal oxide semiconductor field effect transistors for each additional input, separate input means connected directly to the gate electrodes of each additional metal oxide semiconductor field effect transistor pair, and all of said metal oxide semiconductor field effect transistor pairs being directly connected in cascade with all drain electrodes of one conductivity type connected in common, all drain electrodes of the opposite conductivity type connected in common and all source electrodes connected in common.

* * * * *